United States Patent
Hori

[11] Patent Number: 6,107,174
[45] Date of Patent: *Aug. 22, 2000

[54] SEMICONDUCTOR DEVICE AND A METHOD FOR THE PRODUCTION OF THE SAME

[75] Inventor: Takashi Hori, Takatsuki, Japan

[73] Assignee: Matsushita Electric Industrial Co., Ltd., Osaka-fu, Japan

[*] Notice: This patent is subject to a terminal disclaimer.

[21] Appl. No.: 09/196,405

[22] Filed: Nov. 19, 1998

Related U.S. Application Data

[62] Division of application No. 08/427,633, Apr. 21, 1995, Pat. No. 5,874,766, which is a continuation of application No. 08/113,453, Aug. 27, 1993, abandoned, which is a continuation of application No. 07/758,325, Aug. 28, 1991, Pat. No. 5,254,506, which is a continuation of application No. 07/449,698, Dec. 11, 1989, abandoned.

[30] Foreign Application Priority Data

Dec. 20, 1988 [JP] Japan .................. 63-321186

[51] Int. Cl.$^7$ .................. H01L 21/3205
[52] U.S. Cl. .................. 438/585; 257/411
[58] Field of Search .................. 438/287, 653, 438/762, 585; 257/411

[56] References Cited

U.S. PATENT DOCUMENTS

| | | | |
|---|---|---|---|
| 3,670,403 | 6/1972 | Lawrence et al. | 438/287 |
| 4,282,270 | 8/1981 | Nozaki et al. | 438/769 |
| 4,343,657 | 8/1982 | Ito et al. | 438/250 |
| 4,416,952 | 11/1983 | Nishizawa et al. | 428/698 |
| 4,621,277 | 11/1986 | Ito et al. | 257/411 |
| 4,784,973 | 11/1988 | Stevens et al. | 438/653 |
| 4,851,370 | 7/1989 | Doklan et al. | 438/762 |
| 5,198,392 | 3/1993 | Fukuda et al. | 438/769 |

FOREIGN PATENT DOCUMENTS

| | | |
|---|---|---|
| 0 006 706 A1 | 12/1987 | European Pat. Off. . |
| 62-33469 | 2/1987 | Japan . |
| 62-93728 | 12/1987 | Japan . |
| WO 86/03621 | 6/1986 | WIPO . |

OTHER PUBLICATIONS

D.K. Shih et al., "Metal–Oxide–Semiconductor Characteristics of Rapid Thermal Nitrided Thin Oxides", *Applied Physics Letters*, vol. 52, No. 16, May 16, 1988, pp. 1698–1700.

Takashi Ito et al., "Advantages of Thermal Nitride and Nitroxide Gate Films in VLSI Process", *IEEE Transactions on Electron Devices*, vol. ED–29, No. 4, Apr. 1982, pp. 498–502.

Schmidt, MA., et al, "Inversion Layer Mobility of MOSFET's with Nitrided Oxide Gate Dielectrics", *IEEE Transactions on Electron Devices*, 35(10):1627–32, (Oct. 1988).

Copy of European Office Action dated Aug. 31, 1999, in European Application No. 89123598.8 (5 pages).

Hori et al., "Charge–Trapping Properties of Ultrathin Nitrided Oxides Prepared by Rapid Thermal Annealing", *I.E.E.E. Transactions on Electronic Devices*, vol. 35, No. 7, pp. 904–910 (Jul. 1988).

(List continued on next page.)

*Primary Examiner*—Wael Fahmy
*Assistant Examiner*—William David Coleman
*Attorney, Agent, or Firm*—Akin, Gump, Strauss, Hauer & Feld, L.L.P.

[57] ABSTRACT

A semiconductor device is disclosed which comprises a semiconductor substrate and an insulating film disposed on the substrate. The insulating film is a oxynitride film prepared by nitriding a thermal oxide film, which has been formed on the substrate, in an atmosphere of nitriding gas. The nitriding is conducted for a nitridation time of $10^{6.6-T_N/225}$ seconds or shorter wherein $T_N$ is the nitridation temperature in degree centigrade, or conducted so as to have a nitrogen concentration of about 8 atomic % or less, at least in the vicinity of the interface between the oxynitride film and the substrate. Also disclosed is a method for the production of the semiconductor device.

13 Claims, 9 Drawing Sheets

OTHER PUBLICATIONS

Henscheid et al., "Dielectric Formation by Rapid Thermal Nitridation", *Extended Abstracts,* vol. 88–2, pp. 433–434 (Oct. 9–14, 1988).

Hori et al., "Improvement of Dielectric Strength . . . Nitrided Oxides", *VLSI Sump. Tech. Dig.,* pp. 63–64 (1987).

Henscheid et al., "RTN of Thin $SiO_2$ Films", *Journal of Electronic Materials,* vol. 18, pp. 99–104, No. 2 (1989).

Vasquez & Madhukar, "A Kinetic Model for the Thermal Nitridation of $SiO_2/Si$", *J. Appl. Phys.* vol. 60(1), pp. 234–242.

Moslehi & Saraswat, "Thermal Nitridation of Si and $SiO_2$ for VLSI", *I.E.E.E. Trans. Elec. Dev.,* vol. Ed. 32, No. 2, pp. 106–113 (Feb. 2, 1985).

Hori et al., "Improvement of Dielectric Integrity of $TiSi_x$–Polycide–Gate System by Using Rapidly Nitrided Oxides", *Journal of the Electrochemical Society,* vol. 136, No. 10 (Oct. 1985).

Moslehi et al., "Rapid Thermal Nitridation of $SiO_2$ for Nitroxide Thin Dielectrics", *Appl. Phys. Lett.* vol. 47(10), pp. 1113–1115 (Nov. 1985).

SEMICONDUCTOR DEVICE AND A METHOD FOR THE PRODUCTION OF THE SAME

CROSS-REFERENCE TO RELATED APPLICATIONS

This application is a division of application Ser. No. 08/427,633, filed Apr. 21, 1995, now U.S. Pat. No. 5,874,766, which is a continuation of Ser. No. 08/113,453, which was filed on Aug. 27, 1993 (now abandoned), which was a continuation of Ser. No. 07/758,325, filed on Aug. 28, 1991 (now U.S. Pat. No. 5,254,506), which was a continuation of Ser. No. 07/449,698, which was filed Dec. 11, 1989 (now abandoned).

BACKGROUND OF THE INVENTION

The present invention relates to a minute metal oxide semiconductor field-effect device (herein-after referred to as MOS device) and a method for the production of a high-performance insulating film used in the MOS device.

Previously, a thermal oxide film formed on a semiconductor substrate was used as the gate oxide film for MOS devices. In a minute MOS device using a conventional thermal oxide film as the gate insulating film, deterioration of mobility caused by an increase in the electric field acting perpendicular to the channel has become a serious problem. Since the deterioration of mobility reduces the current driving capability and switching speed of the MOS device, it has been one of the major factors working against the further miniaturization of the MOS device.

On the other hand, it has been studied among some researchers to use a oxynitride film instead of the thermal oxide film in a minute MOS device for improvement of reliability such as dielectric strength. At the present point of time, however, the oxynitride film can only provide a very low mobility as compared to the thermal oxide film, which has been one of the serious problems preventing the oxynitride film from coming in practice.

SUMMARY OF THE INVENTION

A semiconductor device of this invention, which overcomes the above-discussed and numerous other disadvantages and deficiencies of the prior art, comprises a semiconductor substrate and an insulating film disposed on the substrate, wherein the insulating film is a oxynitride film prepared by nitriding a thermal oxide film, which has been formed on the substrate, in an atmosphere of nitriding gas for a nitridation time of $10^{6.6-T_N/225}$ seconds or shorter wherein $T_N$ is the nitridation temperature in degree centigrade.

In a preferred embodiment, the oxynitride film is used as a gate insulating film.

Another semiconductor device of this invention comprises a semiconductor substrate and an insulating film disposed on the substrate, wherein the insulating film is a oxynitride film prepared by nitriding a thermal oxide film, which has been formed on the substrate, so as to have a nitrogen concentration of about 8 atomic % or less, at least in the vicinity of the interface between the oxynitride film and the substrate.

In a preferred embodiment, the oxynitride film is used as a gate insulating film.

A method for the production of a semiconductor device, which overcomes the above-discussed and numerous other disadvantages and deficiencies of the prior art, comprises the steps of forming a thermal oxide film on the substrate and nitriding said thermal oxide film in an atmosphere of nitriding gas for a nitridation time of $10^{6.6-T_N/225}$ seconds or shorter wherein $T_N$ is the nitridation temperature in degree centigrade.

In a preferred embodiment, rapid heating by means of radiation is used in the nitriding step.

Another method for the production of a semiconductor device comprises the steps of forming a thermal oxide film on the substrate and nitriding the thermal oxide film in an atmosphere of nitriding gas so as to have a nitrogen concentration of about 8 atomic % or less, at least in the vicinity of the interface between the oxynitride film and the substrate.

In a preferred embodiment, rapid heating by means of radiation is used in said nitriding step.

Thus, the invention described herein makes possible the objectives of (1) providing a semiconductor device which has a submicron MOS gate insulating film with superior performance to a thermal oxide film; and (2) providing a method for the production of such a semiconductor device.

According to the present invention, it is possible to form a oxynitride film with a high mobility as well as markedly improved resistance to mobility deterioration caused by a high vertical electric field, in a very short time. Also, redistribution of the impurities formed in the semiconductor substrate can be prevented. Moreover, effective mobility in a high electric field can be improved as compared to thermal oxide films.

BRIEF DESCRIPTION OF THE DRAWINGS

This invention may be better understood and its numerous objects and advantages will become apparent to those skilled in the art by reference to the accompanying drawings as follows:

FIG. 6b is a graph of the field effect mobility $\mu_{FE}$ at the time of formation of a high vertical electric field of 3.3

MV/cm within the insulating film, against the nitridation time with respect to various oxynitride films used as the insulating film.

DESCRIPTION OF THE PREFERRED EMBODIMENTS

FIGS. 1a to 1f shows the production of a semiconductor device of this invention. The semiconductor device is of an MOS type, which is produced as follows.

Figure 1A:
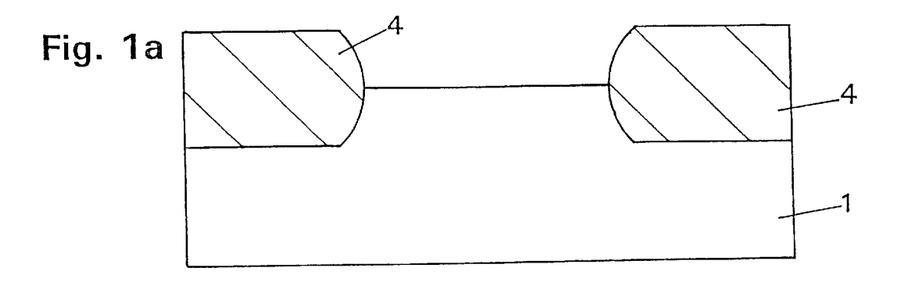
FIGS. 1a to 1f are schematic diagrams showing the production of a semiconductor device of this invention.
Figure 1B:
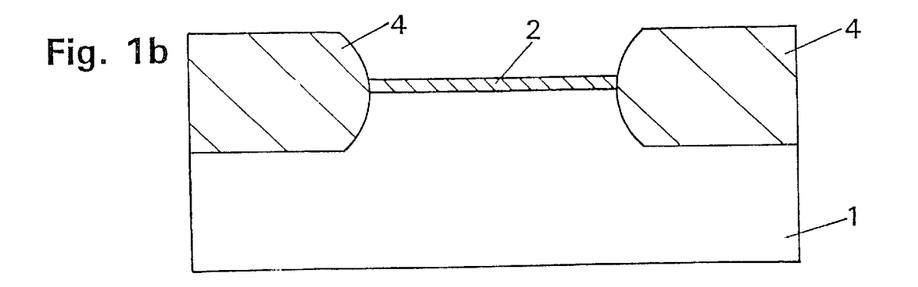
Figure 1C:
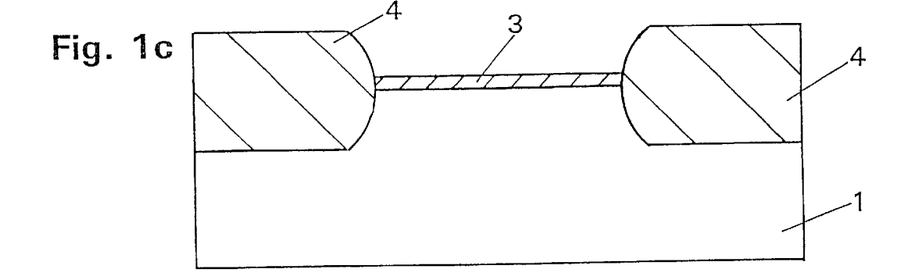

First, on a semiconductor substrate 1 made of silicon, an isolation insulating film 4 is formed by, for example, local oxidation of silicon (LOCOS), as shown in FIG. 1a. Then, a thermal oxide film 2 is formed on the semiconductor substrate 1 as shown in FIG. 1b. The thermal oxide film 2 is converted into a oxynitride film 3, as shown in FIG. 1c, by heating in an atmosphere of ammonia gas for a short time by the use of a short-time heating furnace.

Figure 1D:
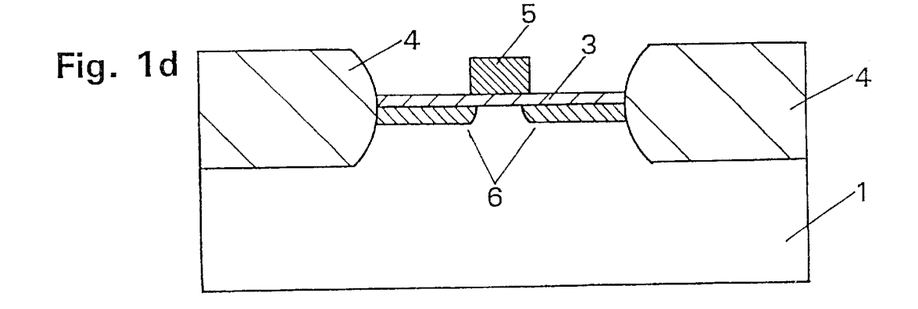

Thereafter, material for the gate electrode, such as polysilicon, is deposited on the entire surface and etched to form a gate electrode 5. Then, source and drain regions 6 are formed in a self-alignment manner by the use of an ion injection method as shown in FIG. 1d.

Figure 1E:
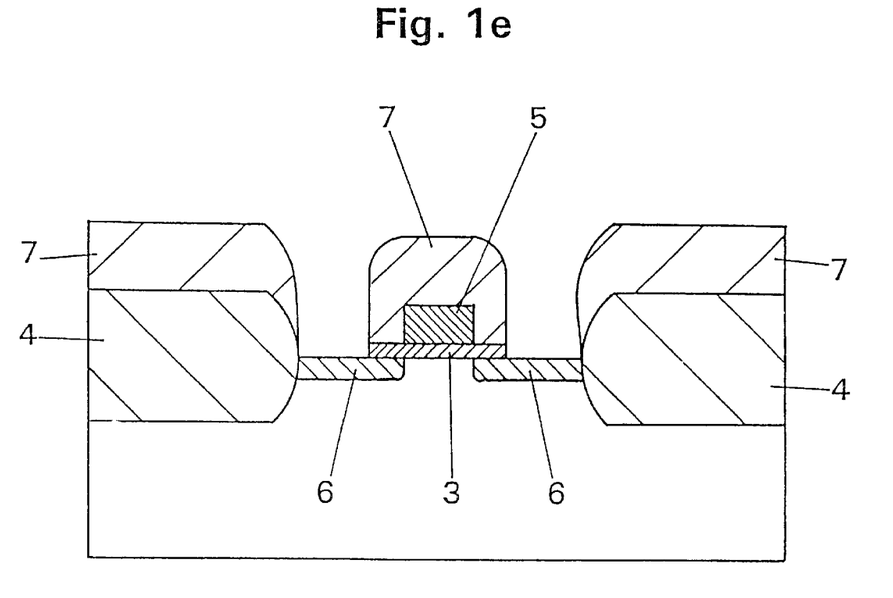
Figure 1F:
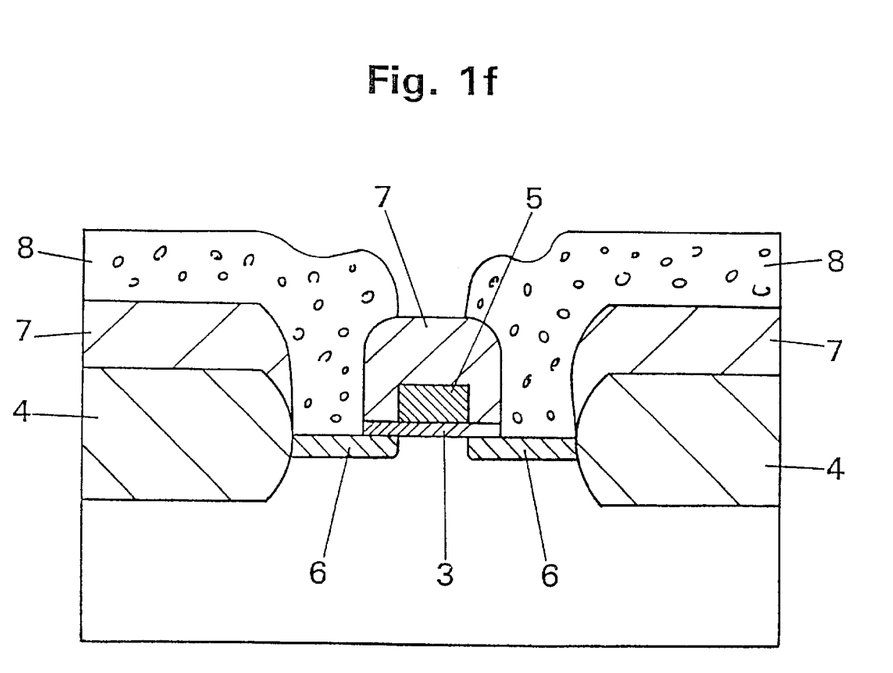

Next, an interlayer insulating film 7 is deposited on the entire surface, followed by the formation of contact holes for the source and drain regions 6 as shown in FIG. 1e, and then aluminum electrodes 8 are formed as shown in FIG. 1f, resulting in an MOS device of this invention.

Figure 2:
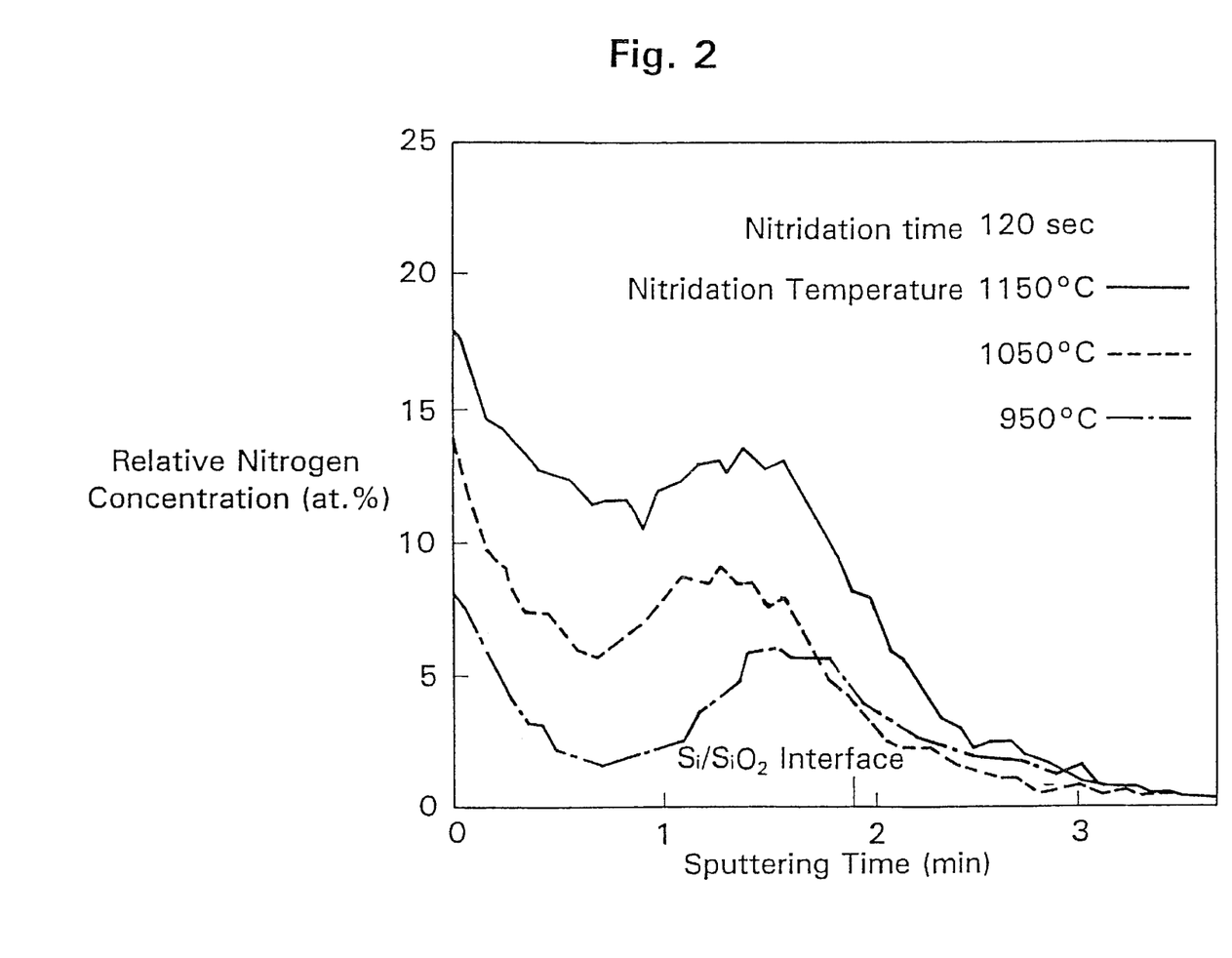
FIG. 2 is a diagram showing the nitrogen profile in various oxynitride films measured by Auger spectroscopy.

FIG. 2 shows the nitrogen profiles measured by Auger spectroscopy in the oxynitride films formed by nitriding for 120 seconds at temperatures of 950° C., 1050° C., and 1150° C., respectively. The samples used for the measurements correspond to the oxynitride film 3 shown in FIG. 1c. The nitride oxide film has oxynitride layers formed in the vicinity of the surface of the film, as well as in the vicinity of the interface between the insulating film and the semiconductor substrate, and a higher nitrogen concentration is obtained at a higher nitridation temperature. It can be seen from FIG. 2 that a relatively high concentration of nitrogen can be introduced into the insulating film even with such a short nitridation time.

Next, MOS device samples having the gate length and gate width both 100 μm were produced as shown in FIG. 1f, and their electrical characteristics were examined. The thickness of the gate oxide film formed was 7.7 nm.

Figure 3A:
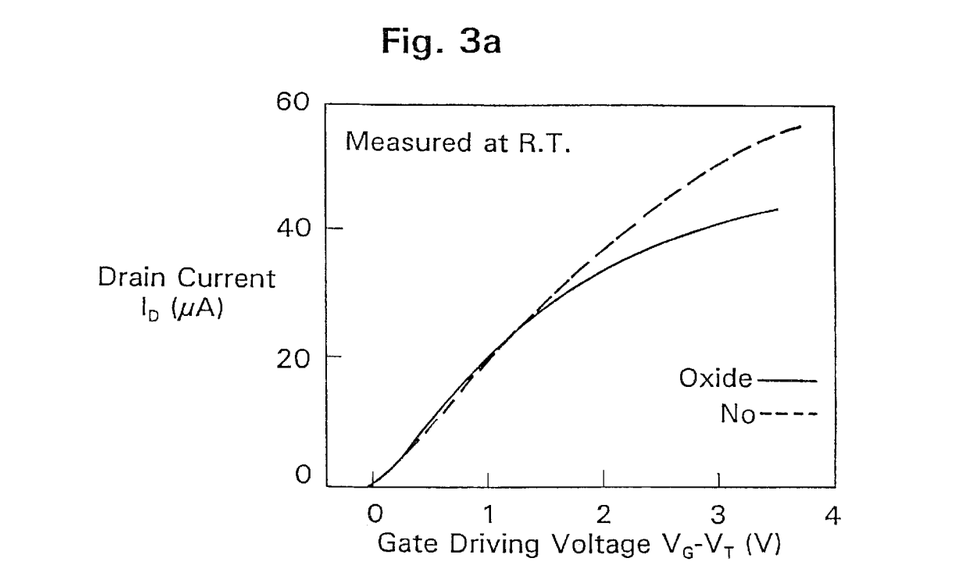
FIG. 3a is a graph of the drain current $I_D$ against the gate driving voltage $V_G-V_T$ at room temperature with respect to a 7.7 nm thick oxide film and a oxynitride film (NO) formed by nitriding for 60 seconds at 950° C.
Figure 3B:
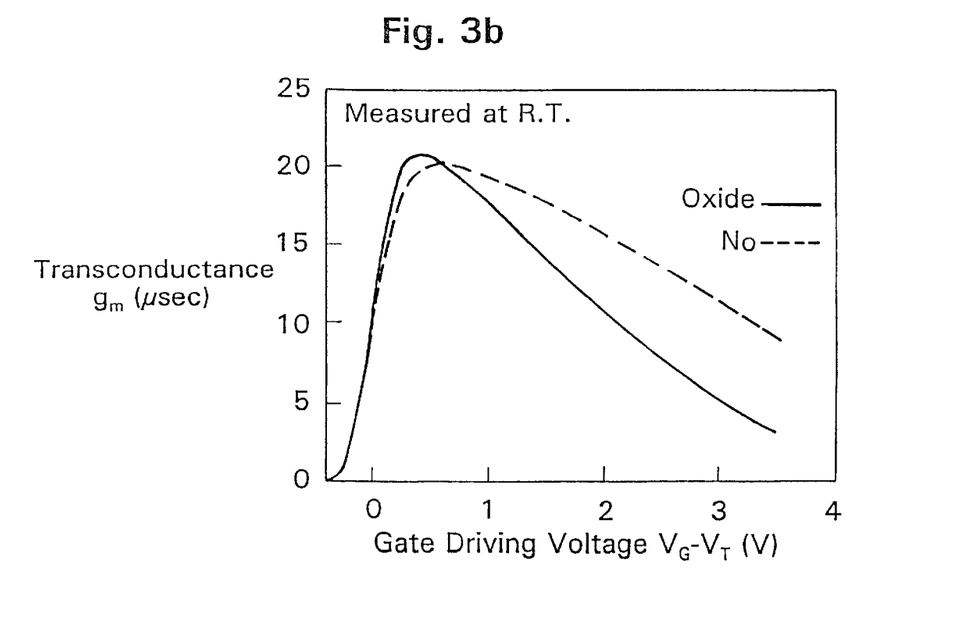
FIG. 3b is a graph of the transconductance $g_m$ against the gate driving voltage $V_G-V_T$ at room temperature with respect to a 7.7 nm thick oxide film and a oxynitride film (NO) formed by nitriding for 60 seconds at 950° C.

In FIGS. 3a and 3b, respectively, the drain current $I_D$ and transconductance $g_m$ at the room temperature of the 7.7 nm thick oxide film and of the oxynitride film (NO) formed by nitriding for 60 seconds at 950° C. are plotted against the gate driving voltage $V_G-V_T$. In the case of the oxide film, the transconductance drops markedly and the drain current is low at high gate driving voltages (1.5 V or higher) because of the significant deterioration of the mobility caused by a high vertical electric field. On the other hand, in the case of the oxynitride film (NO), it can be seen that the maximum transconductance occurring at relatively low driving voltages (approximately 0.5 to 1 V) is almost as great as that of the oxide film, while marked improvement is achieved with respect to the deterioration of transconductance as observed in the oxide film at high gate driving voltages (1.5 V or higher), thus resulting in a very large drain current.

Figure 4A:
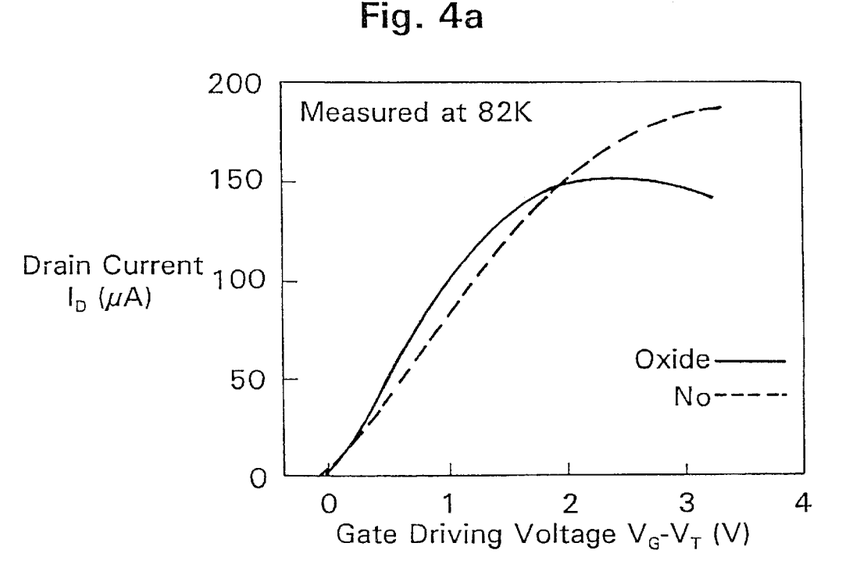
FIG. 4a is a graph of the drain current $I_D$ against the gate driving voltage $V_G-V_T$ at 82 K with respect to a 7.7 nm thick oxide film and a oxynitride film (NO) formed by nitriding for 60 seconds at 950° C.
Figure 4B:
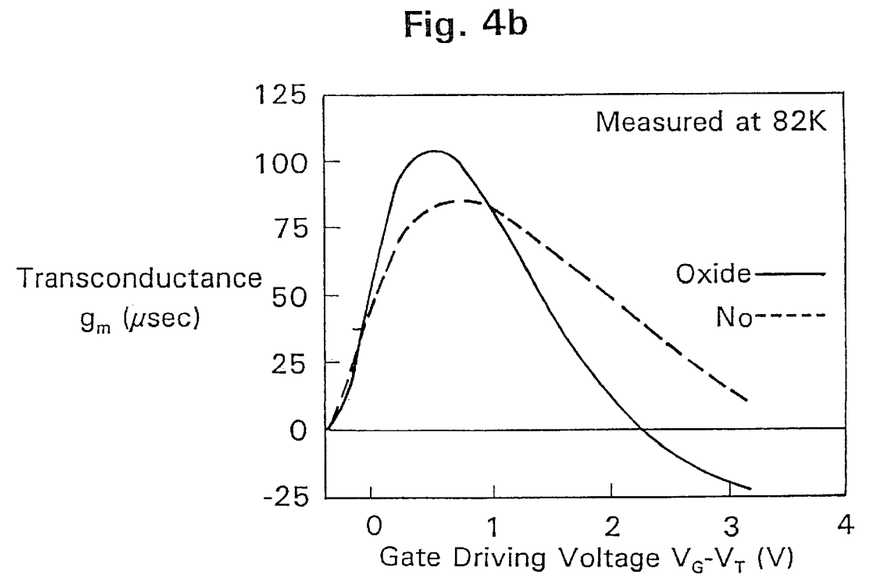
FIG. 4b is a graph of the transconductance $g_m$ against the gate driving voltage $V_G-V_T$ at 82 K with respect to a 7.7 nm thick oxide film and a oxynitride film (NO) formed by nitriding for 60 seconds at 950° C.

In FIGS. 4a and 4b, respectively, the drain current $I_D$ and transconductance $g_m$ at 82 K of the same samples as shown in FIGS. 3a and 3b are plotted against the gate driving voltage $V_G-V_T$. In the case of the oxide film, the transconductance drops markedly at high gate driving voltages (1.5 V or higher) and the drain current is low as at room temperature. In addition, the oxide film shows a negative transconductance in which the drain current decreases as the gate driving voltage is increased. This is because the deterioration of mobility caused by a high vertical electric field becomes more appreciable as the temperature lowers. On the other hand, in the case of the oxynitride film (NO), while the maximum transconductance occurring at relatively low driving voltages (approximately 0.5 to 1 V) is slightly smaller than that of the oxide film, the negative transconductance as observed in the oxide film is not present, thus resulting in a larger drain current than the oxide film at high gate driving voltages (1.5 V or higher).

Figure 5A:
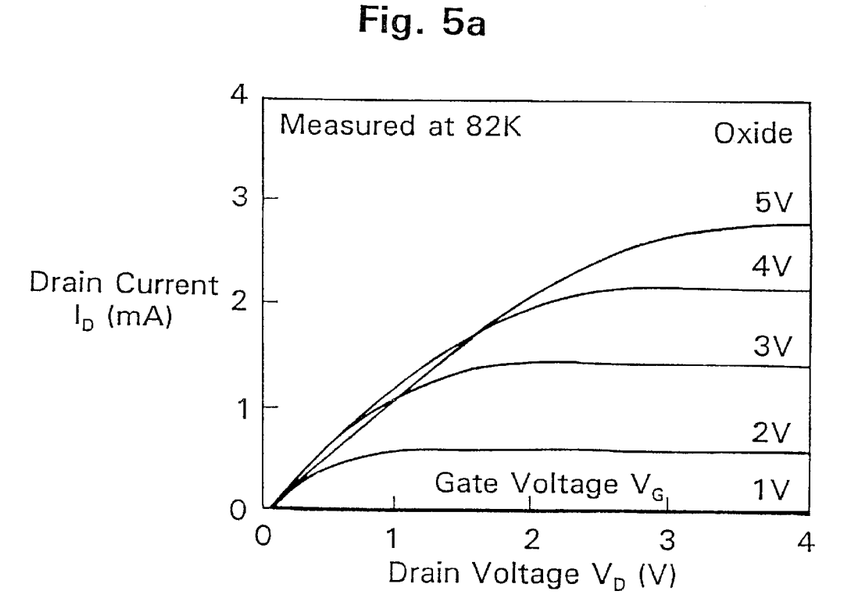
FIGS. 5a and 5b are of characteristic curves showing the saturation current at 82 K with respect to an oxide film and a oxynitride film (NO) formed by nitriding for 60 seconds at 950° C., respectively.
Figure 5B:
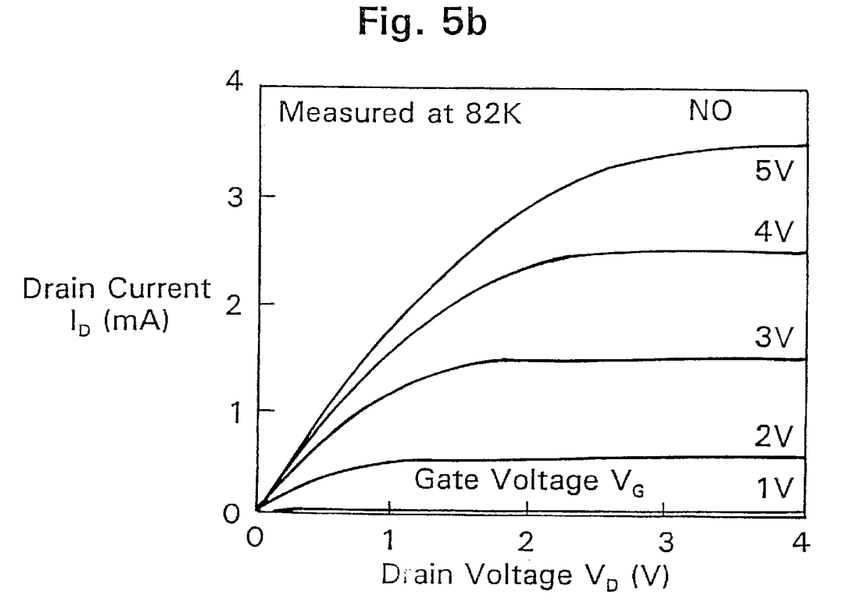

Such a remarkable improvement in performance can also be observed in the saturation current characteristics. FIGS. 5a and 5b show the saturation current characteristics at 82 K of the oxide film and the oxynitride film (NO) formed by nitriding for 60 seconds at 950° C., respectively. In the case of the oxide film, the transconductance is extremely small and the drain current is low at particularly high gate driving voltages (3 V or higher). This is caused because of the aforementioned negative transconductance inherent in the oxide film. On the other hand, in the case of the oxynitride film (NO), it can be seen that the significant improvement is achieved with respect to the deterioration of transconductance at particularly high gate driving voltages (3 V or higher), thus resulting in a very large drain current.

Figure 6A:
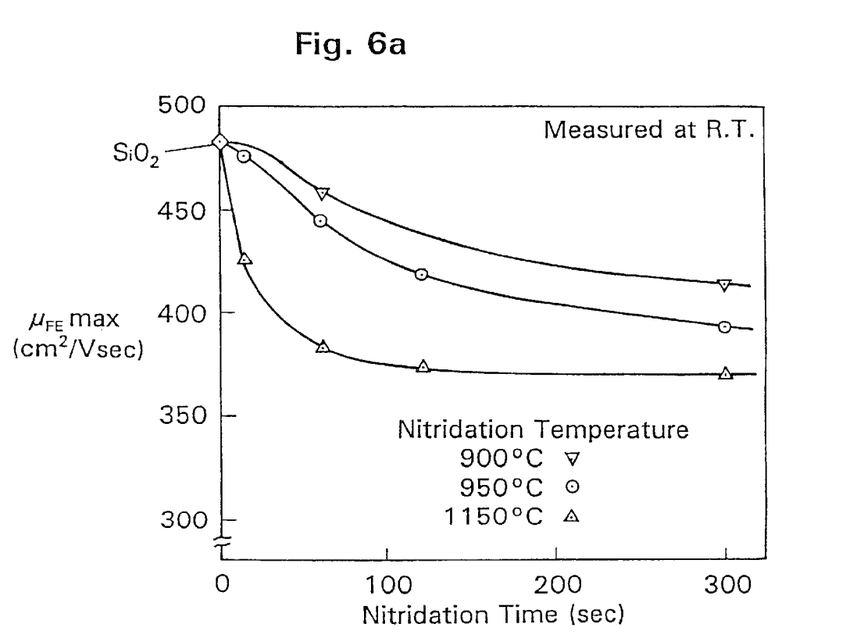
FIG. 6a is a graph of the maximum field effect mobility $\mu_{FEmax}$ at room temperature, against the nitridation time with respect to various oxynitride films.
Figure 6B:
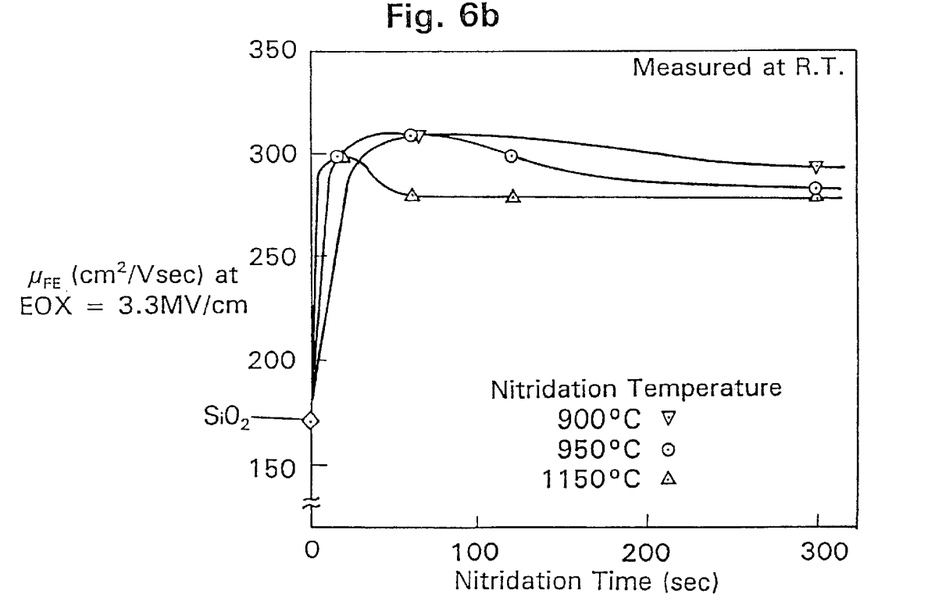

In FIGS. 6a and 6b, respectively, the maximum field effect mobility at room temperature and the field effect mobility at the time of formation of a high vertical electric field of 3.3 MV/cm within the insulating film are plotted against the nitridation time for examination of their dependency on nitriding conditions. The field effect mobility $\mu_{FE}$ is defined as follows:

$$\mu_{FE} = \frac{L}{W} \cdot \frac{1}{V_D} \cdot \frac{1}{C_i} \cdot \frac{\partial I_D}{\partial (V_G - V_T)}$$

where L is the channel length, W is the channel width, $V_D$ is the drain voltage, $C_i$ is the capacitance per unit area of the insulating film, $I_D$ is the drain current, and $V_G-V_T$ is the gate driving voltage. The field effect mobility $\mu_{FE}$ is considered as a mobility for small signals and therefore significantly reflects the tendency of a mobility at each voltage $V_G-V_T$. It can be seen from FIG. 6a that the maximum field effect mobility at relatively low driving voltages (approximately 0.5 to 1 V) is the greatest in the case of the oxide film and decreases as the nitriding proceeds, i.e., as the nitridation time becomes longer or as the nitridation temperature increases. On the other hand, it can be seen from FIG. 6b that the field effect mobility in a high vertical electric field of 3.3 MV/cm increases markedly even with a very short nitridation time. For example, with nitriding for only 15 seconds at 950° C., the obtained mobility in a high electric field is approximately two times greater than that obtained in the case of the oxide film. Even when the nitriding is continued for a longer time, the improved field effect mobility in a high electric field shows very little change. From the fact that nitriding provides improved resistance to the deterioration of field effect mobility in a high electric field inherent in the oxide film, it will be appreciated that the oxynitride layer formed near the interface by nitriding as shown in FIG. 2 greatly contributes to the substantial improvement of the above-mentioned field effect mobility.

Figure 7A:
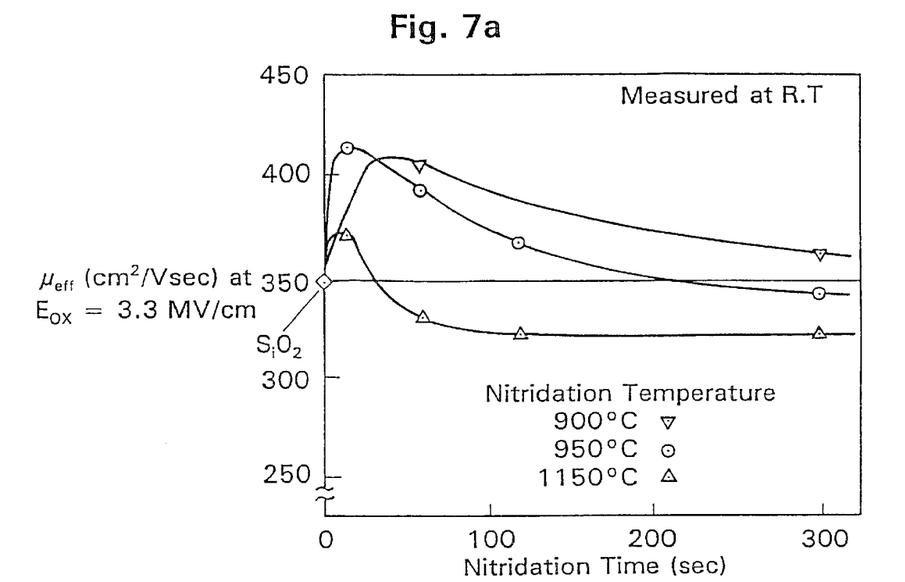
FIGS. 7a and 7b are graphs of the effective mobility $\mu_{eff}$ in a high vertical electric field of 3.3 MV/cm at room temperature and at 82 K, respectively, against the nitridation time.
Figure 7B:
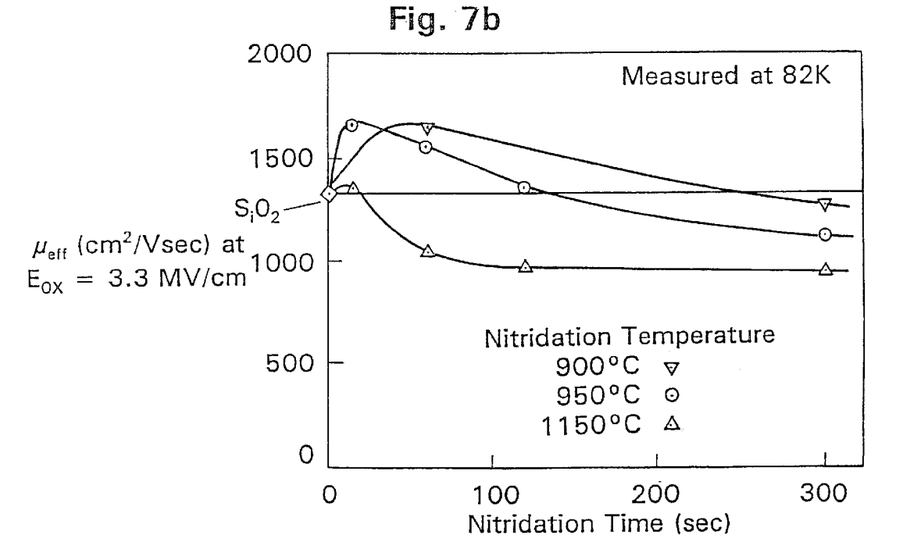

In FIGS. 7a and 7b, the effective mobility in a high vertical electric field of 3.3 MV/cm at room temperature and at 82 K are plotted against the nitridation time for examination of their dependency on nitriding conditions. The effective mobility $\mu_{eff}$ is defined as follows:

$$\mu_{eff} = \frac{L}{W} \cdot \frac{1}{V_D} \cdot \frac{1}{C_i} \cdot \frac{I_D}{(V_G - V_T)}$$

In contrast to the field effect mobility $\mu_{FE}$ mentioned above, the effective mobility $\mu_{eff}$ is considered as a mobility for large signals and hence considered to represent the actually measured circuit operation speed more accurately. The effective mobility is affected by both the maximum field effect mobility $\mu_{FEmax}$ and the field effect mobility $\mu_{FE}$ in a high electric field. The relationship between the effective mobility $\mu_{eff}$ and the maximum field effect mobility $\mu_{FEmax}$ and field effect mobility $\mu_{FE}$ in a high electric field can be derived as follows:

$$\mu_{eff} = \frac{\mu_{FEmax} \cdot (V_G - V_T)_{max} + \int_{(V_G - V_T)_{max}}^{V_G - V_T} \mu_{FE} dV}{V_G - V_T}$$

where $(V_G - V_T)_{max}$ is the gate driving voltage at the time when $\mu_{FEmax}$ is obtained. It can be seen from FIG. 7a that at each nitridation temperature, the effective mobility shows an increase at first, reaches a maximum after a certain nitridation time, and then gradually decreases. A higher nitridation temperature causes this tendency to progress in a shorter time. With lighter nitriding conditions, for example, with a shorter nitridation time, the improvement of the field effect mobility in a high electric field is obtained in a very short time as compared to the deterioration of the maximum field effect mobility as shown in FIG. 6, thus improving the effective mobility as compared to the oxide film and resulting in a larger driving current. On the other hand, with heavier nitriding conditions, for example, with a longer nitridation time, the effect of the deterioration of the maximum field effect mobility becomes dominant, which causes the effective mobility to become smaller than that of the oxide film, thus resulting in the deterioration of the driving current. FIG. 7b shows that the same tendency as observed at room temperature applied to the case measured at 82 K. However, the range of the nitridation time in which a greater effective mobility than the oxide film is obtained becomes narrow and strict as compared to the case at room temperature.

Figure 8:
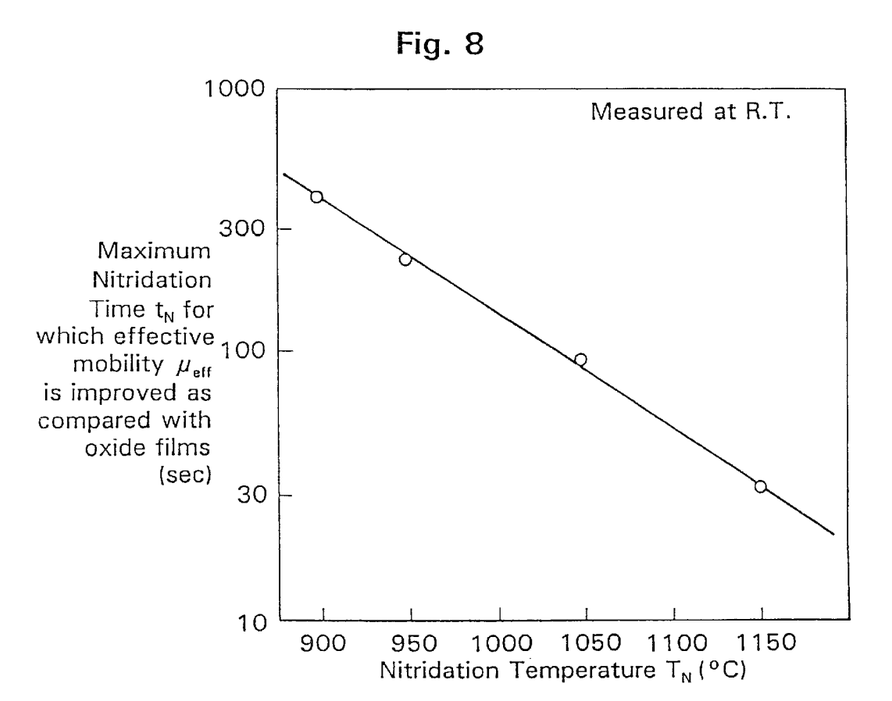
FIG. 8 is a graph of the maximum nitridation time $t_N$ which accomplishes the improvement of effective mobility as compared to the oxide film, against the nitridation temperature $T_N$.

In FIG. 8, the maximum nitridation time $t_N$ (sec) which accomplishes the improvement of effective mobility as compared to the oxide film is plotted against the nitridation temperature $T_N$ (°C). it can be seen from FIG. 8 that the relationship $t_N = 10^{6.6-T} N^{/225}$ is established at room temperature. This means that the nitridation time of $10^{6.6-T} N^{/225}$ or shorter should be chosen to form the oxynitride film in order to accomplish a circuit operation speed as compared to the oxide film.

Figure 9:
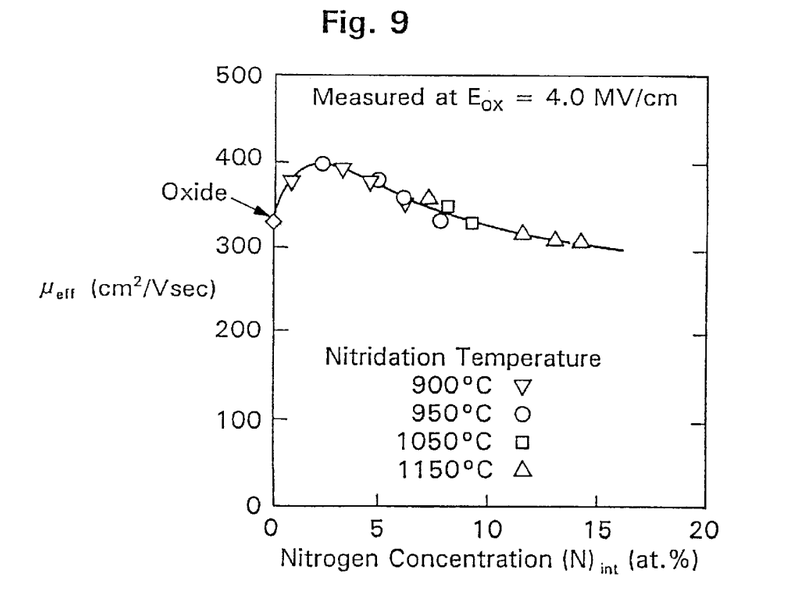
FIG. 9 is a graph of the effective mobility $\mu_{eff}$ in a high vertical electric field of 4 MV/cm within the insulating film, which is measured by Auger spectroscopy, against the nitrogen concentration $[N]_{int}$ in the vicinity of the interface between the insulating film and the substrate.

FIG. 9 shows a graph of the effective mobility $\mu_{eff}$ in a high vertical electric field of 4.0 MV/cm, which is measured by Auger spectroscopy, against the nitrogen concentration $[N]_{int}$ in the vicinity of the interface between the insulating film and the substrate. The oxynitride film used as a gate insulating film of the MOS field-effect device was formed by heating in an atmosphere of ammonia gas for a short time with the use of a short-time heating furnace. It can be seen from FIG. 9 that the effective mobility $\mu_{eff}$ shows an increase at first as the nitrogen concentration $[N]_{int}$ increases, reaches a maximum at a concentration of around 2 to 3 atomic %, and then monotonously decreases. It can also be seen from this figure that a oxynitride film having a nitrogen concentration $[N]_{int}$ of about 8 atomic % or less can be used to obtain an improved effective mobility in a high electric field useful for operation in an actual circuit, as compared to the thermal oxide film.

As described above, according to the present invention, an insulating film having a high mobility can be obtained by an extremely simple method. With the use of such an insulating film in a minute MOS device, the deterioration of mobility in a high vertical electric field can be significantly reduced, thus offering useful advantages of a higher current driving capability and a faster circuit operating speed in practical use.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for fabricating a semiconductor device, comprising:
    forming a gate insulating film on a surface of a semiconductor substrate;
    forming a gate electrode on a surface of the gate insulating film; and
    forming a source region and a drain region in the semiconductor substrate,
    wherein the step of forming the gate insulating film includes forming a thermal oxide film on the semiconductor substrate, and introducing nitrogen into the thermal oxide film from a top surface thereof contacting the gate electrode, to a bottom surface thereof contacting the semiconductor substrate, to form a single-layered film made of an oxynitride film as the gate insulating film.

2. The method according to claim 1, wherein the oxynitride film is formed through a nitridation process of the thermal oxide film.

3. The method according to claim 2, wherein the nitridation process includes heating the thermal oxide film in an ammonia atmosphere for a short period of time.

4. The method according to claim 1, wherein a nitrogen concentration of the oxynitride film in a thickness direction thereof is higher at the vicinity of the bottom surface and at the vicinity of the top surface than at a center portion.

5. The method according to claim 1, further comprising forming contact holes for the gate and drain regions.

6. The method according to claim 5, wherein the oxynitride film is provided at least over the source region and the drain region positioned on sides of the gate electrode.

7. The method according to claim 5, wherein the oxynitride film is provided over the source region and the drain region except for portions where the contact holes are provided.

8. The method according to claim 5, further comprising forming an interlayer insulating film over the source region and the drain region with the oxynitride film interposed therebetween, and the contact holes are provided through the interlayer insulating film and the oxynitride film.

9. The method according to claim 1, further comprising forming an isolation insulating film on the semiconductor substrate prior to the formation of the gate insulating film.

10. The method according to claim 1, wherein the semiconductor substrate is made of silicon.

11. The method according to claim 1, wherein the gate electrode is made of polysilicon.

12. A semiconductor device, comprising:

a semiconductor substrate;

a gate insulating film formed on a surface of the semiconductor substrate;

a gate electrode formed on a surface of the gate insulating film; and a source region and a drain region formed in the semiconductor substrate, wherein the gate insulating film is a single-layered film made of an oxynitride film including nitrogen from a top surface thereof contacting the gate electrode, to a bottom surface thereof contacting the semiconductor substrate, the gate insulating film being provided through introduction of nitrogen into a thermal oxide film formed on the semiconductor substrate.

13. The semiconductor device according to claim 12, wherein the oxynitride film is formed through a nitridation process of the thermal oxide film.

* * * * *